United States Patent
Cai

(10) Patent No.: US 8,063,443 B2
(45) Date of Patent: Nov. 22, 2011

(54) HYBRID-MODE LDMOS

(75) Inventor: Jun Cai, Scarborough, ME (US)

(73) Assignee: Fairchild Semiconductor Corporation, South Portland, MA (US)

( * ) Notice: Subject to any disclaimer, the term of this patent is extended or adjusted under 35 U.S.C. 154(b) by 716 days.

(21) Appl. No.: 11/927,805

(22) Filed: Oct. 30, 2007

(65) Prior Publication Data

US 2009/0108346 A1   Apr. 30, 2009

(51) Int. Cl.
*H01L 27/07* (2006.01)
(52) U.S. Cl. ........ 257/335; 257/336; 257/337; 257/338; 257/339; 257/341; 257/342; 257/E27.029
(58) Field of Classification Search .......... 257/335–339, 257/341–342, E27.029
See application file for complete search history.

(56) References Cited

U.S. PATENT DOCUMENTS 6,870,218 B2   3/2005   Cai
7,125,777 B2   10/2006   Cai et al.

OTHER PUBLICATIONS

Texas Instruments, TrueDrive Technology proeduct inforamtion sheet, 2006 (1 page).

*Primary Examiner* — Cuong Q Nguyen
*Assistant Examiner* — Tran Tran
(74) *Attorney, Agent, or Firm* — Thomas R. FitzGerald, Esq.; Hiscock & Barclay, LLP

(57) ABSTRACT

An MOS-bipolar hybrid-mode LDMOS device has a main gate input and a control gate input wherein the device operates in an MOS mode when both gate inputs are enabled, and operates in a bipolar mode when the main gate input is enabled and the control gate input is disabled. The device can drive the gate of a power MOSFET to deliver the high current required by the power MOSFET while in the bipolar mode, and provide a fully switching between supply voltage and ground to the gate of the power MOSFET while in the MOS mode.

15 Claims, 23 Drawing Sheets

HYBRID-MODE LDMOS

FIELD OF THE INVENTION

This invention relates to power transistors for driver circuits, and more particularly, to hybrid-mode LDMOS for driver circuits.

BACKGROUND OF THE INVENTION

Some MOSFET driver circuits act as an interface between the low-power switching signals such as generated by a pulse width modulator (PWM) and a power MOSFET to provide high drive current to supply the charge to the gate of the power MOSFET and to provide the full rail to rail voltage on the gate. The MOSFET driver circuit's current rating and the power MOSFET gate charge predominately determine how quickly the MOSFET can switch on and off.

Driver circuits using MOS-only drive stages are able to fully switch the power MOSFET between the two power rails, $V_{DD}$ and ground, which is not possible with a bipolar only driver circuit. The disadvantage of a MOS-only driver circuits is the inability to source high gate currents at low voltage, such as the power MOSFET threshold voltage.

As a result compound driver circuits consisting of a combination of bipolar and MOS power devices have been developed. An example of this type of circuit is shown in FIG. 1. In FIG. 1 an input signal passes through an amplifier 10 which drives the gates of an upper P-channel MOSFET 12 and a lower N-channel MOSFET 14, the base of a lower NPN bipolar transistor 16 and is input to an inverter 18, the output of which drives the base of an upper NPN bipolar transistor 20. There is a common node connected to each of the MOSFETs 12, 14 and the bipolar transistors 16, 20 which drives the gate of an N channel power MOSFET 22. A low input signal turns on both P-channel MOSFET 12 and the upper bipolar transistor 20 to turn on the power MOSFET 22 and makes the gate of the power MOSFET 22 to $V_{DD}$. A high input signal turns on both N-channel MOSFET 14 and the lower bipolar transistor 16 to discharge the gate of the power MOSFET 22 and turns the gate of the power MOSFET 22 to ground. The bipolar transistors 16, 20 provide the rated current where it is needed most, at the Miller plateau of the power MOSFET 22.

However, the added high-voltage high-performance bipolar transistors 16, 20 increase fabrication cost. Moreover, the specific on-resistance R (sp, on) of the bipolar transistors 16, 20 can not be simply reduced by scaling its design according to the CMOS lithography rule, as LDMOS does, and therefore a large die size is required for the bipolar transistors 16, 20, even using advanced process technology codes.

SUMMARY OF THE INVENTION

The invention comprises, in one form thereof, an MOS-bipolar hybrid-mode device having a main gate input and a control gate input wherein the device operates in an MOS mode when both gate inputs are enabled, and operates in a bipolar mode when the main gate input is enabled and the control gate input is disabled.

In another form, the invention includes a semiconductor device having a semiconductor die having a horizontal region of a first conductivity type, a first region of a second conductivity type, opposite to the first conductivity type, formed in the horizontal region and extending to a top surface of the horizontal region, and first and second gates positioned over corresponding first and second portions of the first region and separated from the first region by a gate oxide. This form of the invention also includes a conductive region formed in the first region and positioned between the first and second portions such that channel regions below both gates create a conductive path comprising induced channels of the first conductive type and the conductive region, a first contact to the horizontal region, and a second contact to the first region.

In still another form, the invention includes a method of making a semiconductor device comprising the steps of forming a first region of a first conductivity type in a horizontal region of a second conductivity type, opposite to the first conductivity type, in a semiconductor die, the first region extending to a top surface of the horizontal region, forming first and second gates over gate oxide formed on top of the first region, forming a conductive region in the first region positioned laterally between the first and second gates such that channel regions below both gates create a conductive path comprising induced channels of the first conductive type and the conductive region, and forming a first contact in the horizontal region, and a second contact in the first region.

BRIEF DESCRIPTION OF THE DRAWINGS

The aforementioned and other features, characteristics, advantages, and the invention in general will be better understood from the following more detailed description taken in conjunction with the accompanying drawings, in which.

Figure 1:
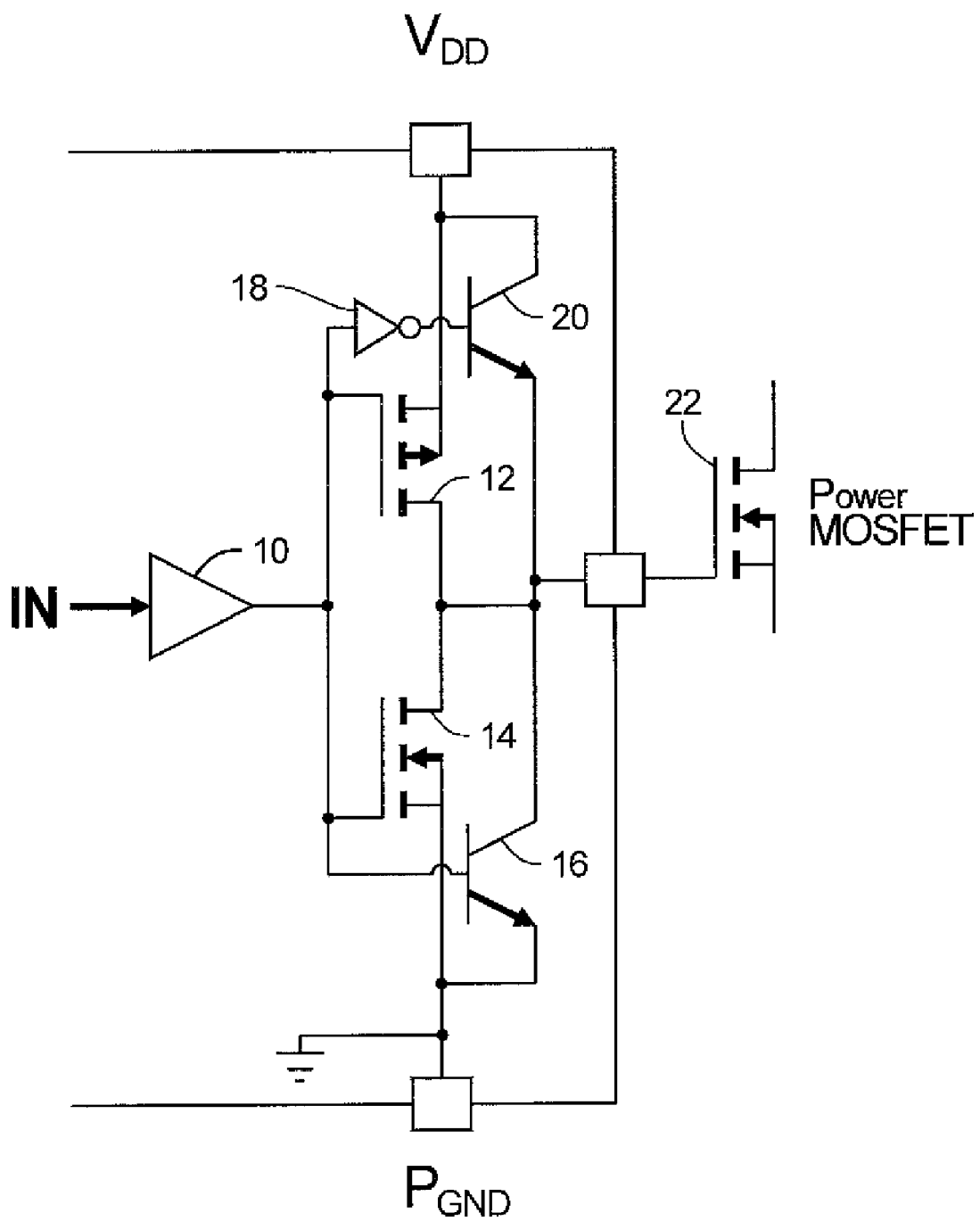
FIG. 1 is a schematic diagram of a prior art combined MOSFET and bipolar driver circuit output stage.

It will be appreciated that for purposes of clarity and where deemed appropriate, reference numerals have been repeated in the figures to indicate corresponding features. Also, the relative size of various objects in the drawings has in some cases been distorted to more clearly show the invention.

DETAILED DESCRIPTION

Figure 2:
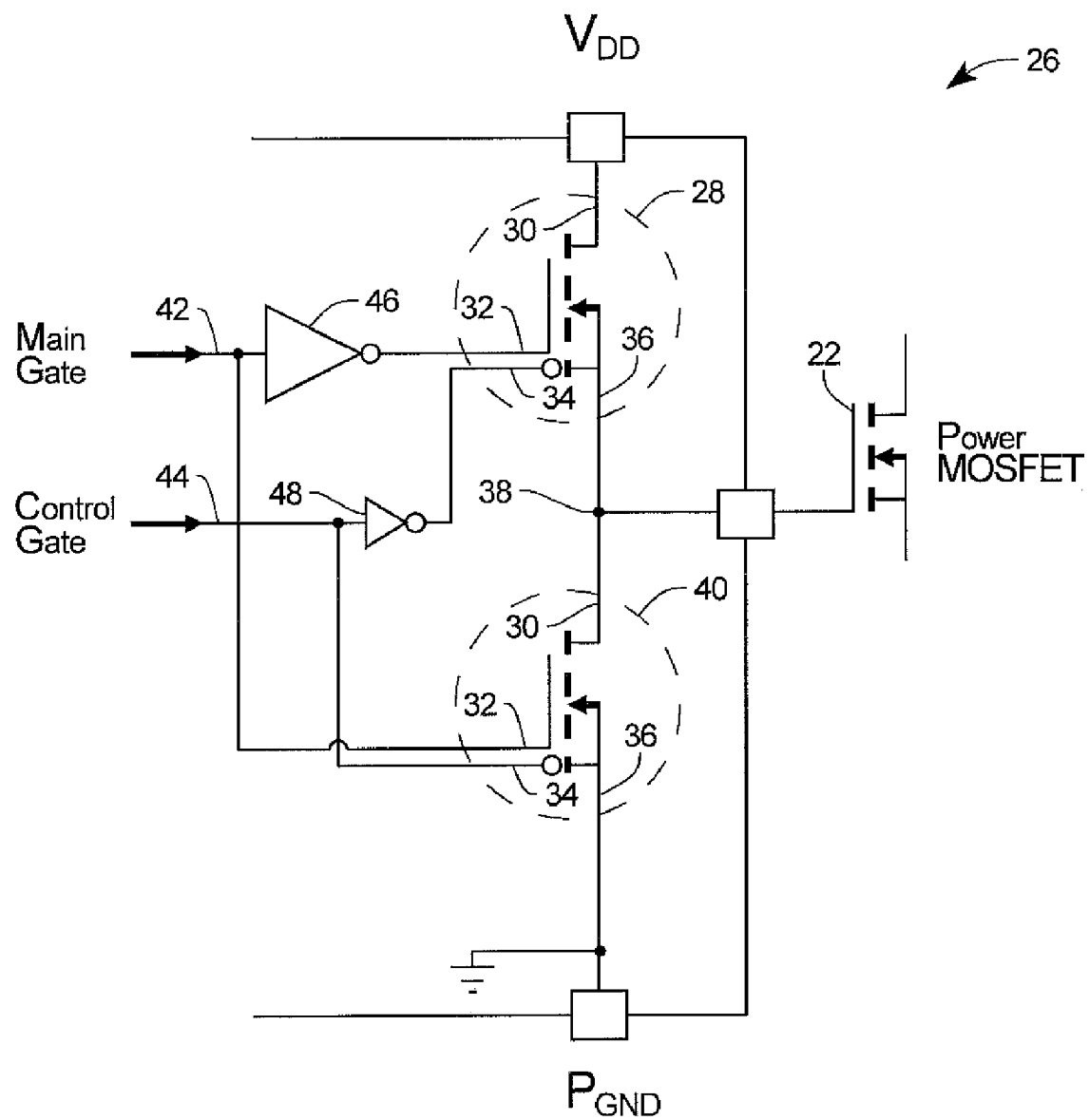
FIG. 2 is a schematic diagram of a driver circuit output stage using dual hybrid-mode LDMOS devices according to the present invention.

Turning now to the drawings, FIG. 2 is a schematic diagram 26 of a driver circuit output stage using two hybrid-mode LDMOS devices 28 and 40, each of which is a hybrid-mode LDMOS device according to the present invention. The hybrid-mode LDMOS devices 28, 40 provide both the bipolar and MOSFET characteristics similar to the combined characteristics of one of the bipolar transistors 16, 20 and the MOSFETs 12, 14 of FIG. 1. Each of the hybrid-mode LDMOS devices 28, 40 have a drain/collector terminal 30, a source/emitter terminal 36, and two gate inputs, a main gate input 32, and a control gate input 34. The driver circuit output stage 26 has a main gate input on terminal 42 and a control gate input on terminal 44. The input terminals 42, 44 are directly connected to the main gate input 32 and the control gate input 34, respectively, of the hybrid-mode LDMOS device 40. The hybrid-mode LDMOS device 40 has it source/emitter terminal 36 grounded and its drain/collector terminal 30 connected to a common node 38 which is connected to the gate of a power MOSFET 22. The signals at the main gate terminal 42 and the control gate terminal 44 are inverted by inverters 46 and 48, respectively, and the inverted signals are applied to the main gate input 32 and the control gate input 34, respectively, of the hybrid-mode LDMOS device 28. The hybrid-mode LDMOS device 28 has it source/emitter terminal 36 connected to the common node 38 and its drain/collector terminal 30 connected to a positive supply voltage $V_{DD}$.

With the N-channel hybrid-mode devices 28, 40 which are described in detail below, a positive voltage on the main gate terminal 42 and the control gate terminal 44 will place the hybrid-mode LDMOS device 40 in an MOS mode and sink current from the node 38 in the same manner as an MOSFET, while the hybrid-mode LDMOS device 28 will be nonconducting. If a positive voltage is placed on the main gate terminal 42 and ground potential is placed on the control gate terminal 44, the hybrid-mode LDMOS device 40 will be in a bipolar mode and sink current from the node 38 in the same manner as a bipolar transistor, while the hybrid-mode LDMOS device 28 will be in an off state. Because the hybrid-mode LDMOS devices 28, 40 receive complementary input signals, if the inputs to the main gate terminal 42 and the control gate terminal 44 are the complements of the two conditions described above, the states of the two hybrid-mode LDMOS devices will be reversed for the two conditions described above except that instead of sinking current from the node 38, the hybrid-mode LDMOS device 28 will supply current to the common node 38.

Figure 3:
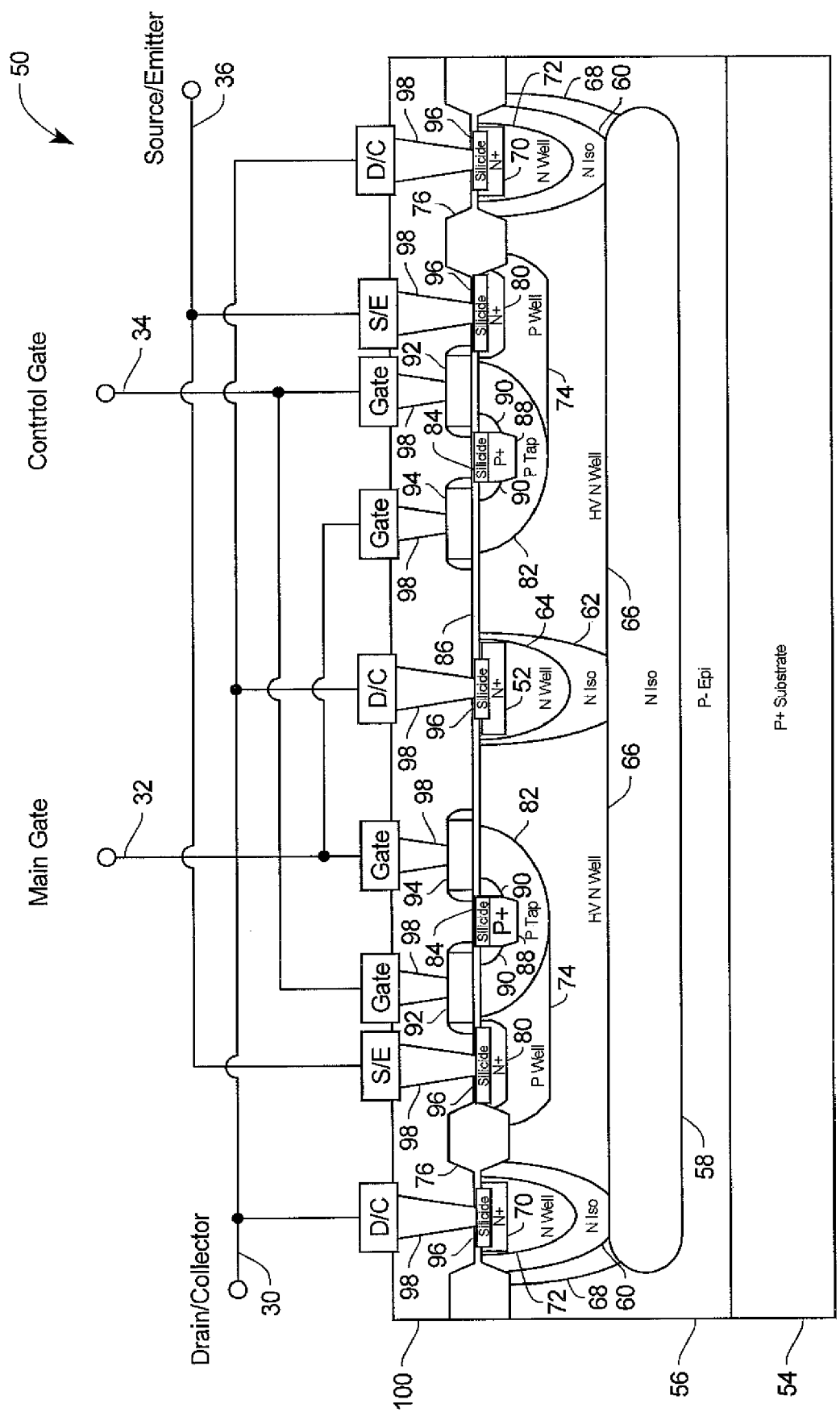
FIG. 3 is a diagrammatical view of the hybrid-mode LDMOS device shown in FIG. 2.

FIG. 3 is a diagrammatical view of a dual symmetrical hybrid-mode LDMOS device 50 which is one of the hybrid-mode LDMOS devices 28 or 40 shown in FIG. 2. The hybrid-mode LDMOS device 50 is symmetrical about an N+ shared drain/collector 52 to provide two "unit" cells. In actual practice it is customary to include a large number of such unit cells in a single die interconnected in parallel to form one large device. The hybrid-mode LDMOS device 50 is formed on a P+ substrate 54 with a P− epi layer 56 grown on top. The active area of the hybrid-mode LDMOS device 50 is contained within N isolation regions having a lower N horizontal isolation region 58 and side N isolation regions 60 which are part of a ring which surrounds the active area of hybrid-mode LDMOS device 50. A center N isolation region 62 encloses an N well 64 which, in turn, surrounds the N+ shared drain/collector 52. Enclosed within the lower N horizontal isolation region 58 and the side N isolation regions 60 shown in FIG. 3 is a high voltage (HV) N well 66. A portion 68 of the HV N well 66 lies outside the side N isolation regions 60. Two additional drain/collectors 70 are surrounded by N wells 72 which, in turn, are surrounded by the side N isolation regions 60.

Two P wells 74 are formed in the P− epi layer 56 between the outside N+ drain/collectors 70 and the N+ shared drain/ collector 52, with field oxides 76 between the outside N+ drain/collectors 70 and the N+ shared drain/collector 52. Source/emitters 80 are located in the P wells 74 adjacent the field oxides 76. In close proximity to the other side of the source/emitters 80 are P body 82 which extend underneath main and control gates to form channel regions there when these gates are on as does standard LDMOS device. The silicide region 84 is located between main gate and control gate and extends from an oxide layer 86 on the surface of the P− epi layer 56 down to P+ tap regions 88. Located on opposite sides of the silicide regions 84 and on the upper portions of the P+ tap regions 88 are N+ spacers 90 which are electrically shorted to the P+ tap regions 88 by silicide regions 84.

Control gates 92 are positioned over the top portions of the P body 82 which lie between the source/emitters 80 and one the N+ spacer regions 90, and main gates 94 are positioned over the corresponding other top portions of the P body 82. Thus the top regions of the P body 82 are located within the channels of the control gates 92 and main gates 94.

The top area of the drain/collects 52, 70 and the source/ emitters 80 have silicide regions 96 which form ohmic contacts to contacts 98 that pass through a dielectric layer 100 to metallization (not shown).

Figure 4:
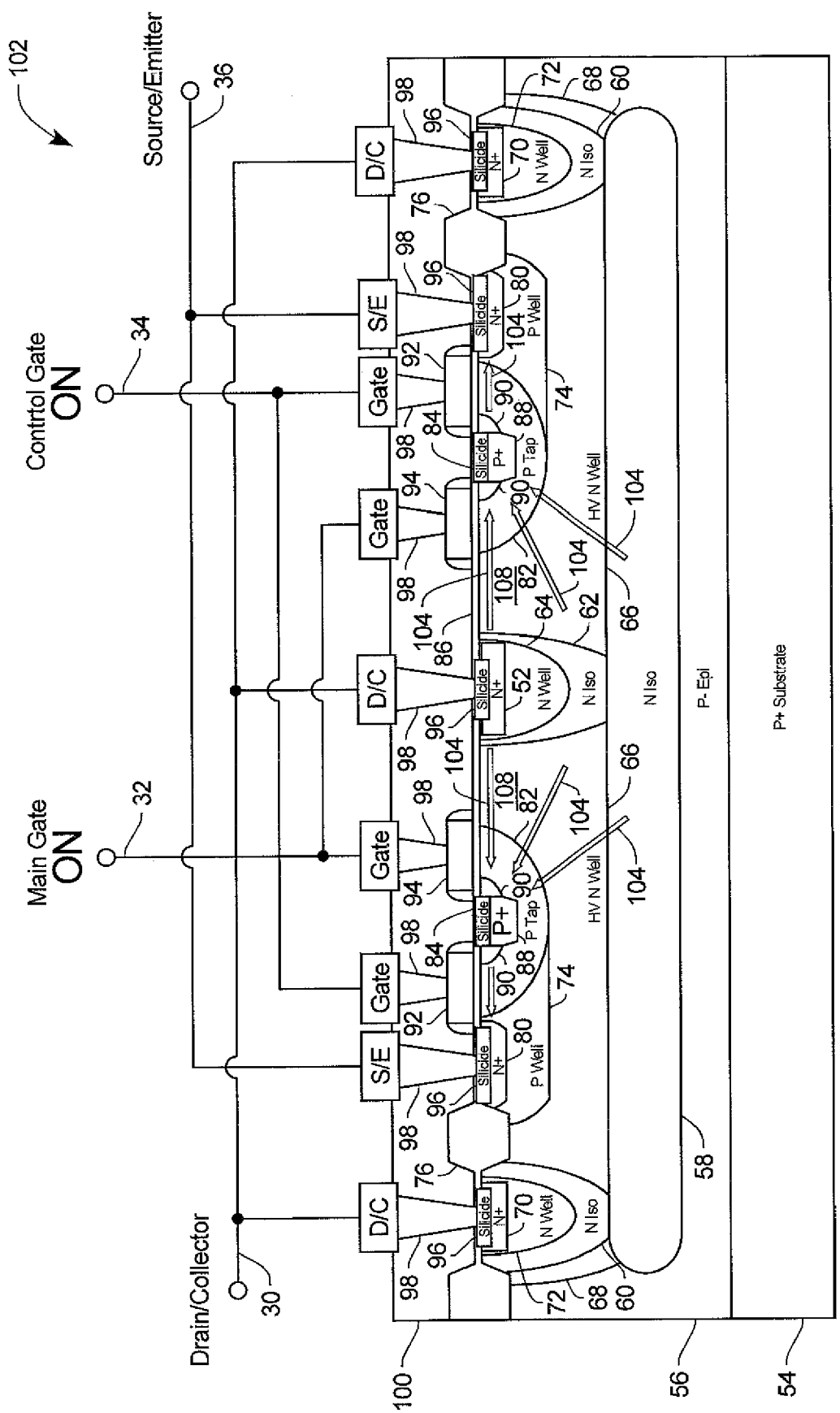
FIG. 4 is a diagrammatical view of the hybrid-mode LDMOS device shown in FIG. 3 with arrows superimposed to show the main current paths through the device when the hybrid-mode LDMOS device is operating in an MOS mode.

FIG. 4 is a diagrammatical view of the hybrid-mode LDMOS device 50 shown in FIG. 3 with arrows 104 superimposed to show the main current paths through the device when the hybrid-mode LDMOS device is operating in an MOS mode. In the MOS mode both the main gate input 32 and the control gate input 34 are on, meaning that they have a positive voltage with respect to the source/emitters 80. Current flows from the drain/collector 52 and through drift regions 108, the channels of the main gates 94, the N+ spacers 90 and the silicide regions 84, the channels of the control gates 92, and into the source/emitters 80. Thus the hybrid-mode LDMOS device 50 when operating in the MOS mode is able to provide an output of a driver circuit at the $V_{DD}$ voltage or at ground voltage. The resistance through the hybrid-mode LDMOS device 50 when operating in the MOS mode is dominated by the drift region 108 and channel regions which can be reduced by scaling according CMOS lithography rules as in standard CMOS devices.

Figure 5:
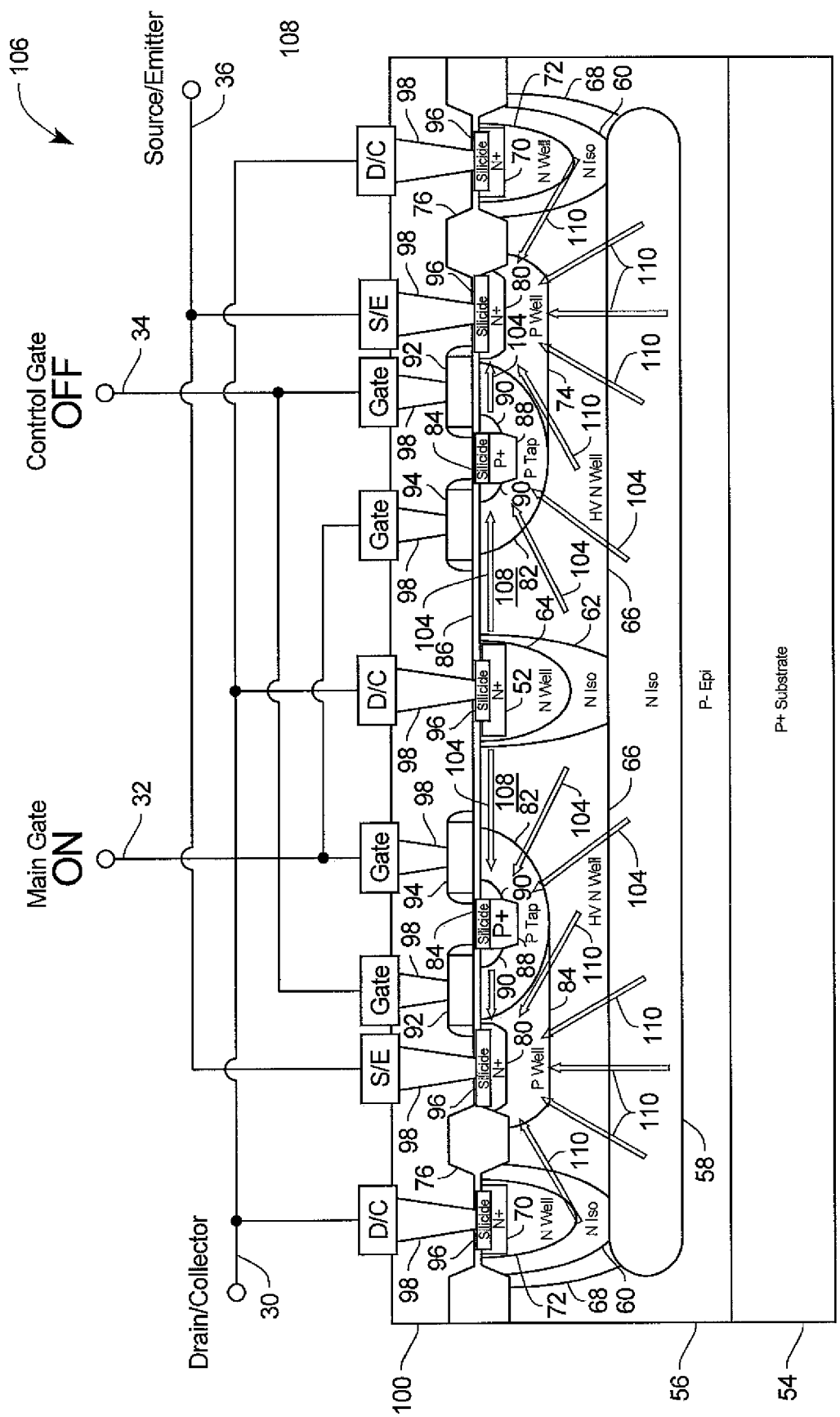
FIG. 5 is a diagrammatical view of the hybrid-mode LDMOS device shown in FIG. 3 with arrows superimposed to show the main current paths through the device when the hybrid-mode LDMOS device is operating in a bipolar mode.

FIG. 5 is a diagrammatical view of the hybrid-mode LDMOS device 50 shown in FIG. 3 with arrows 104 and 110 superimposed to show the main current paths through the device when the hybrid-mode LDMOS device is operating in a bipolar mode. In the bipolar mode the main gate input 32 is on while the control gate input 34 is off. When the main gates are on, the channel electron currents of the main gates 94 pass through the floating N+ spacers 90 and the silicide regions 84, there the electron currents can not flow through the channels of control gates 34 because the control gates 34 are off. The currents in silicide regions 84 are exchanged from electron currents to hole currents into P+ tap regions 88, which flow into the p-body regions 82 as base currents of the hybrid-mode LDMOS. The holes present in the P− body regions 88 flow into P well regions 84 can forward bias the base/emitter (source) junctions to turn-on the junctions and make the hybrid-mode LDMOS working as a bipolar power transistor. The main portion of the current flows from the drain/collectors 52 and 70 to the source/emitter regions 80 will include not only the current flowing from the drain collector 52 through the lateral drift regions 108 but also from N type ISO 58, 60 and 62 through the vertical HV N well drift regions 66. In the bipolar mode the hybrid-mode LDMOS device 50 has a much higher current rating compared to the MOS mode due to current flow not only near the surface (through the channels of the gates as in the MOS mode) but also current flow deep inside the HV N well 66.

Figure 6:
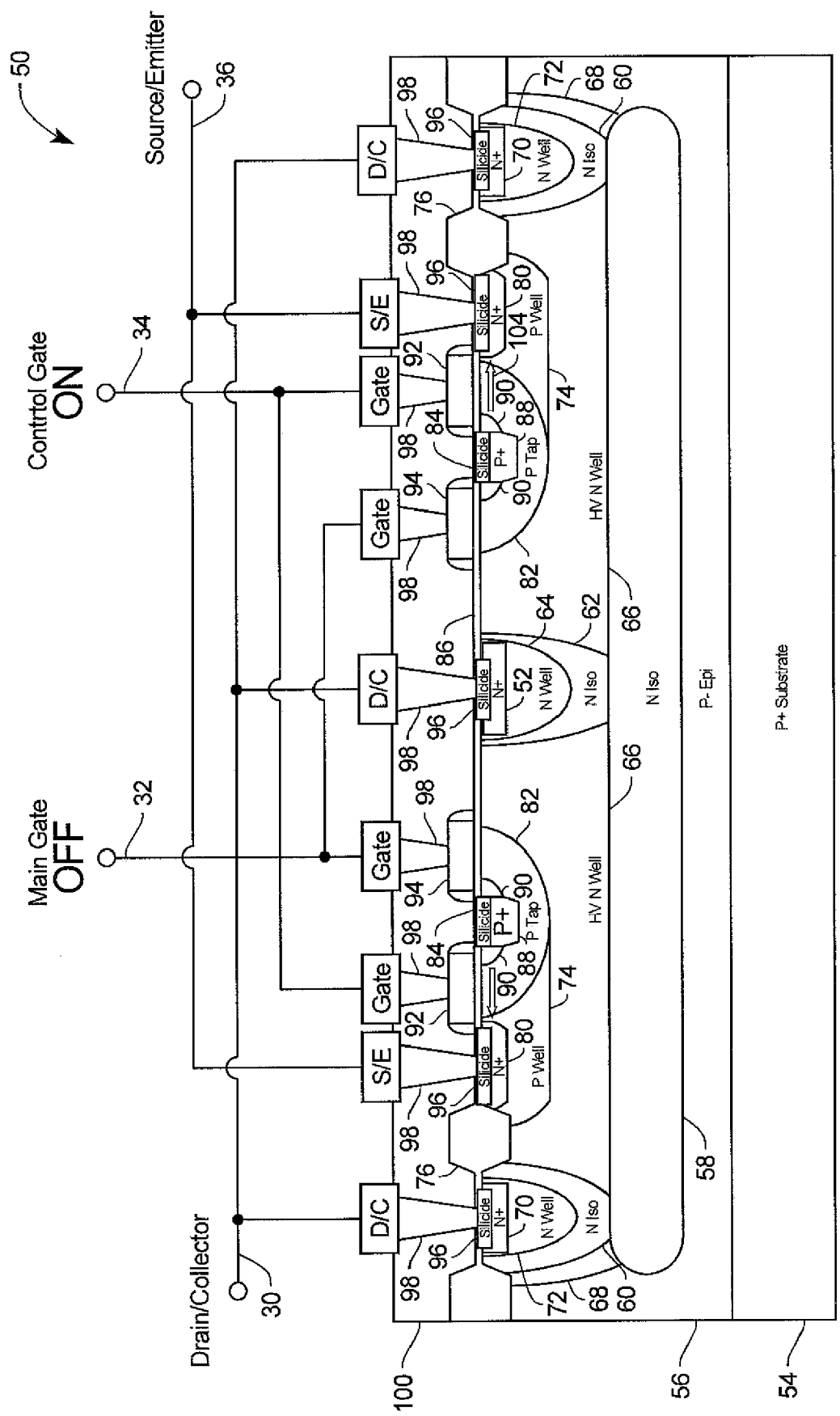
FIG. 6 is a diagrammatical view of the hybrid-mode LDMOS device shown in FIG. 3 in one of the off states.

FIG. 6 is a diagrammatical view of the hybrid-mode LDMOS device 50 shown in FIG. 3 in an off state. In the off state of FIG. 6 the main gate input 32 is off while the control gate input 34 is on. The P body regions 82 collect hole carriers in the P wells 74 which are exchanged to electron carriers in the floating silicide regions 84 and discharged through the source/emitters 80 through the channel of the control gates 92. After hole carriers in P wells 74 are sucked through the channel of the control gates 92, the base/emitter (source) junction is turned-off therefore, the hybrid-mode LDMOS is out of bipolar mode. With the control gate input 34 on, the bipolar mode is inhibited, and with the main gate input 32 off the MOS mode is inhibited. The hybrid-mode LDMOS device 50 is also in an off state when both the main gate input 32 and the control gate input 34 is off.

Figure 7A:
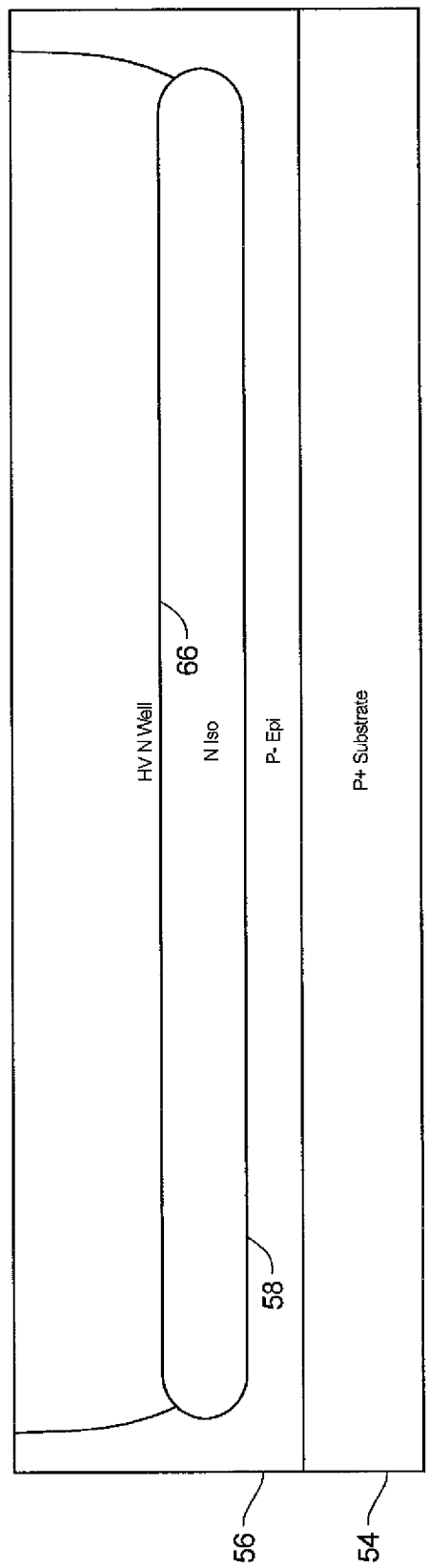
FIGS. 7A-7H are diagrammatical views of the hybrid-mode LDMOS device shown in FIG. 3 during different stages of fabrication.
Figure 7B:
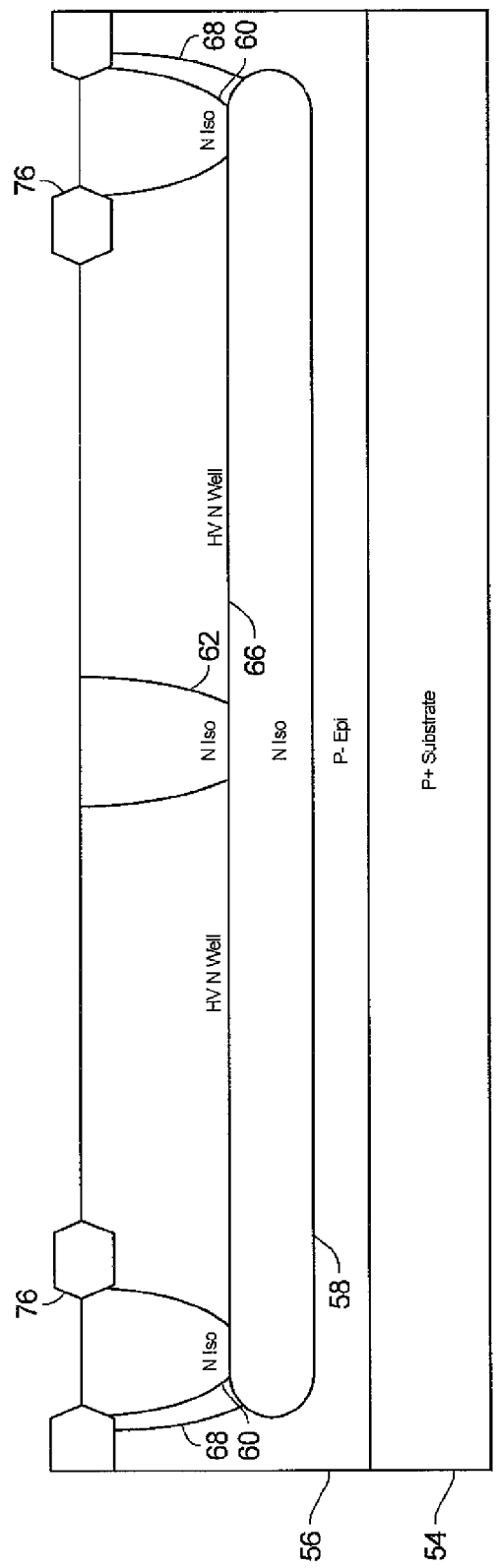
Figure 7C:
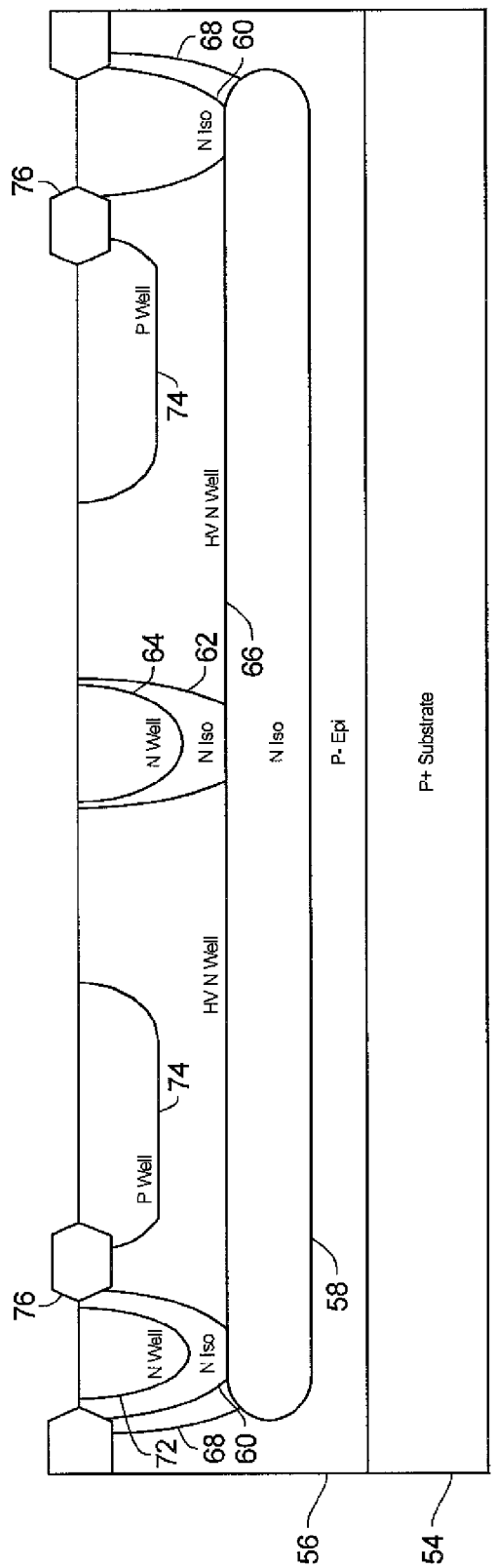
Figure 7D:
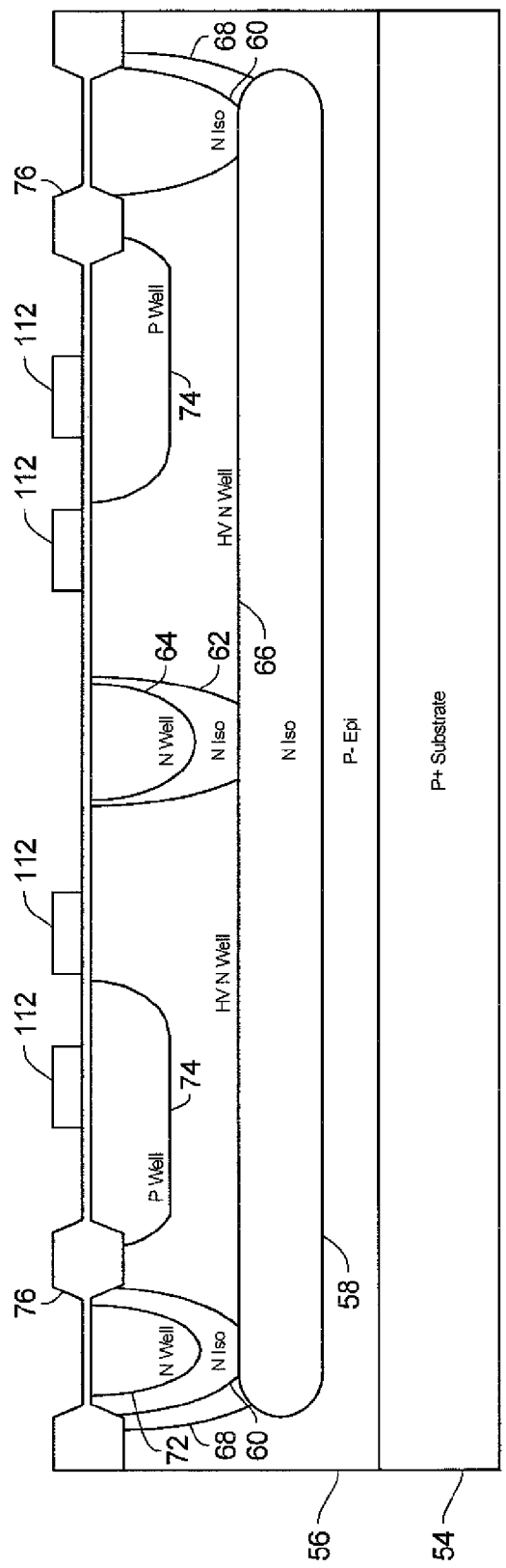
Figure 7E:
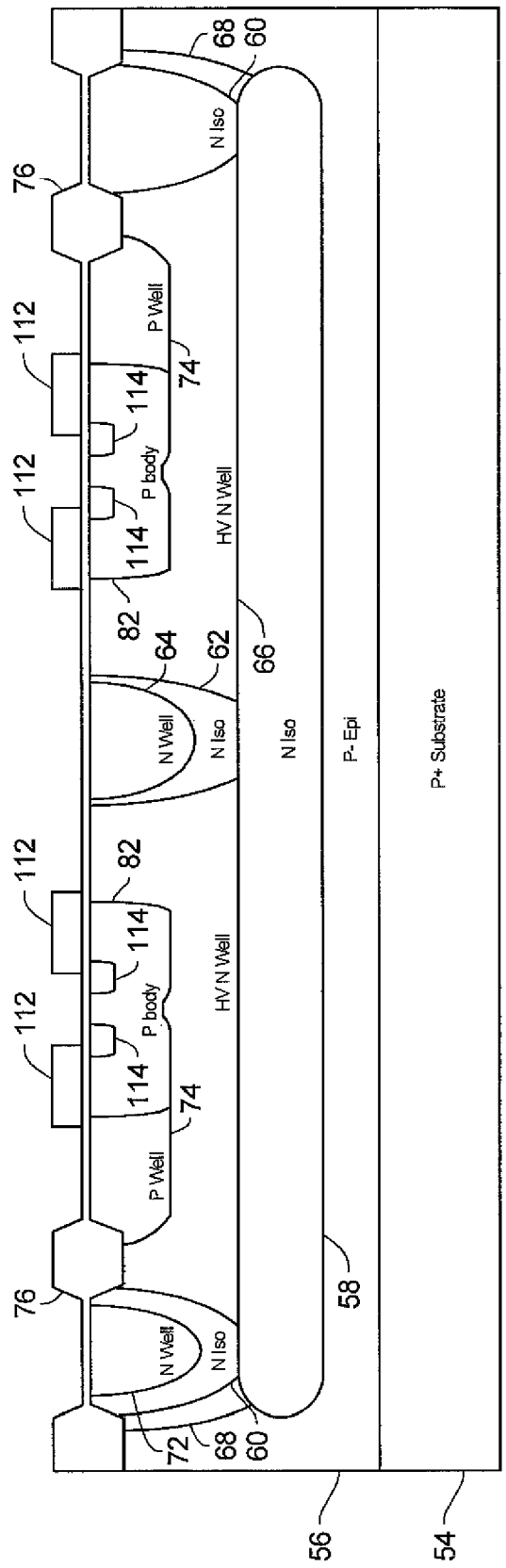
Figure 7F:
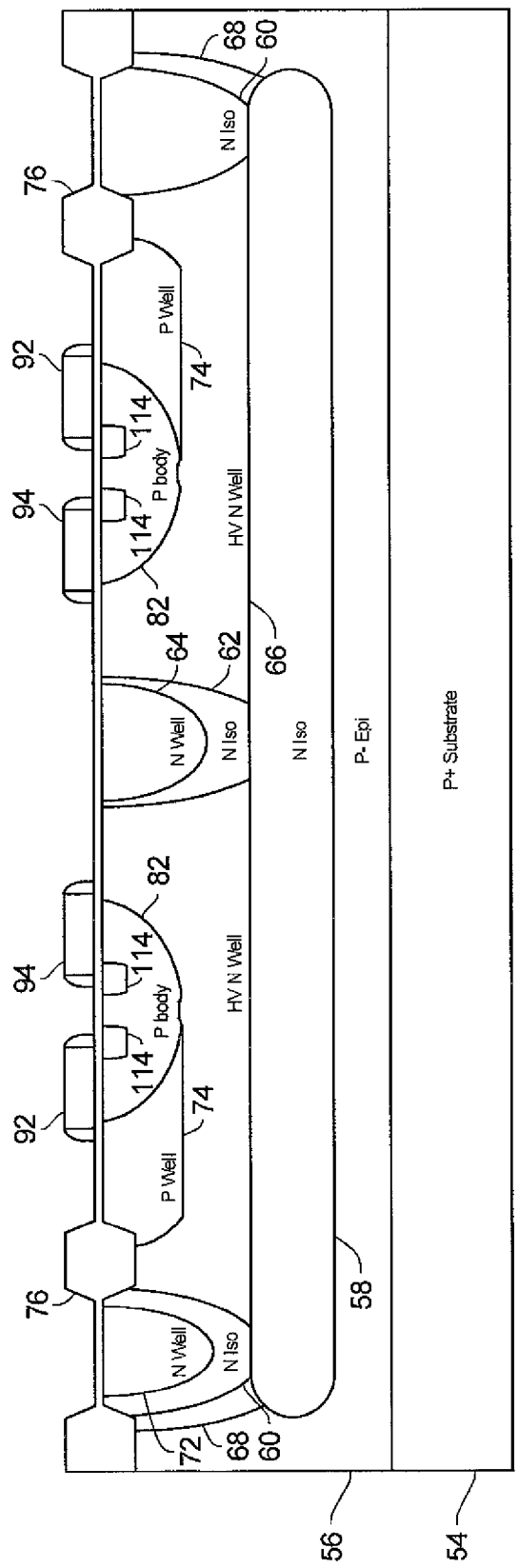
Figure 7G:
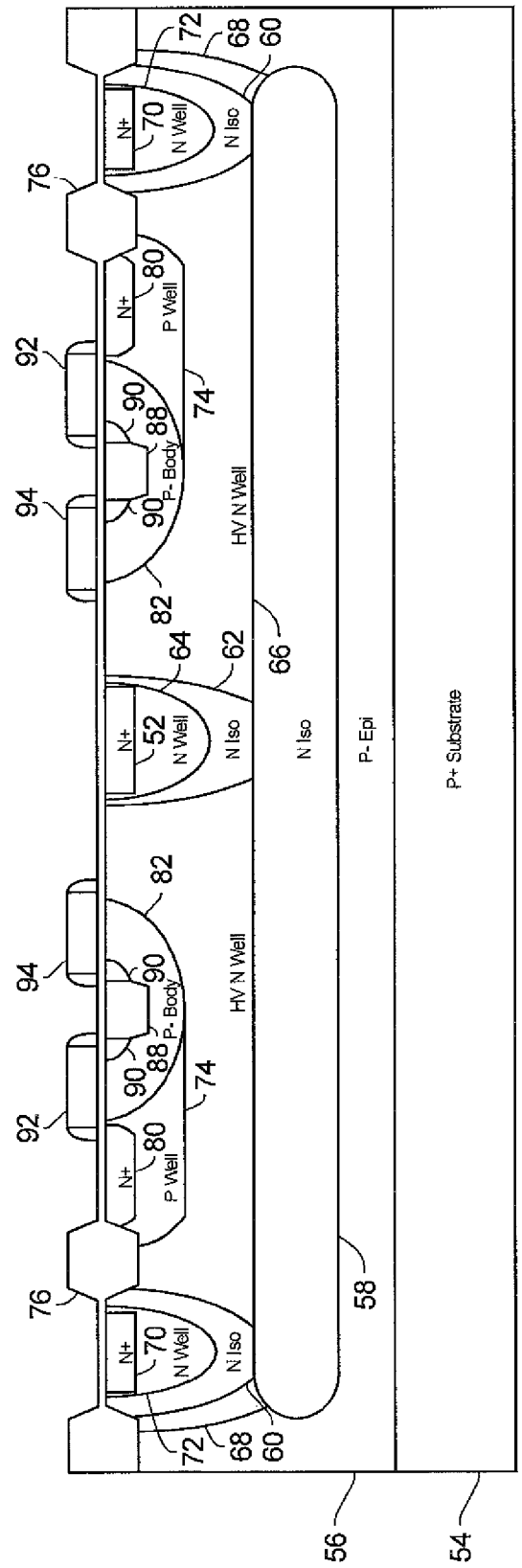
Figure 7H:
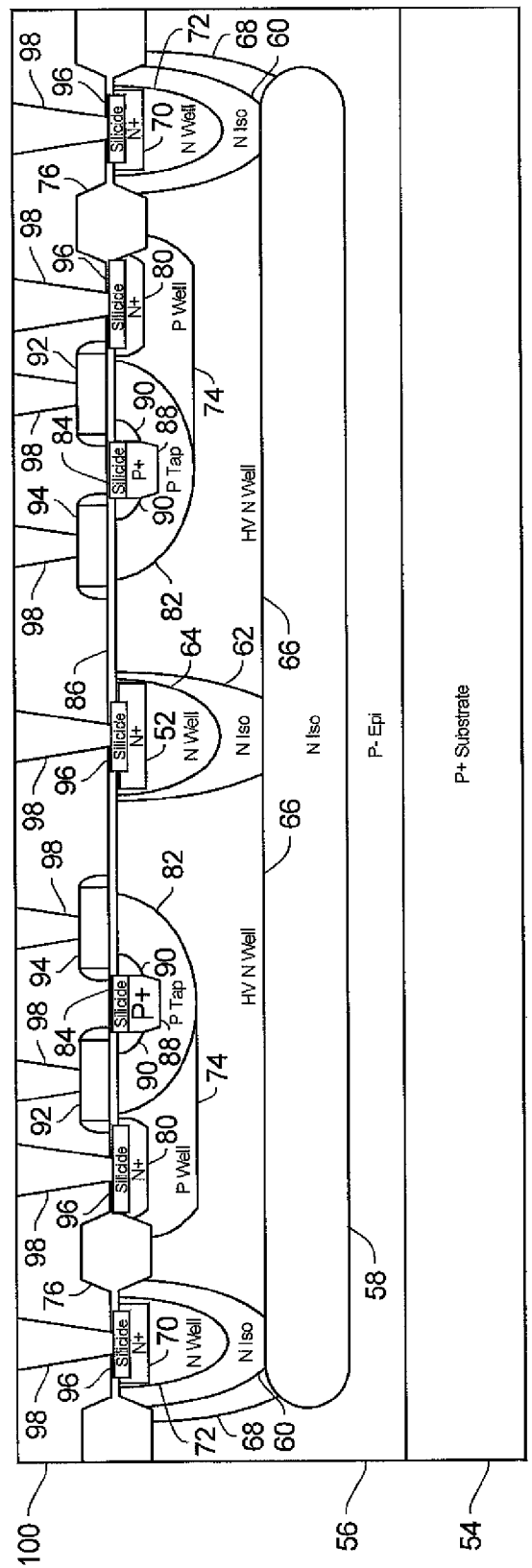

FIGS. 7A-7H are diagrammatical views of the hybrid-mode LDMOS device 50 shown in FIG. 3 during different stages of fabrication. With reference now to FIG. 7A, the device 50 is fabricated starting with the P+ substrate 54, then growing the lower section of the P− epi layer 56, forming the lower N horizontal isolation region 58, and then growing the upper portion of the P− epi layer 56 in a process well know in the art. The HV N well 66 is formed on the lower N horizontal isolation region 58 and extends to the top of the P− epi layer 56. With reference now to FIG. 7B, after the upper section of the P− epi 56 is formed, the side N isolation regions 60 and the center N isolation region 62 are formed and extend to the lower N horizontal isolation region 58. Then, after the field oxides (including the field oxides 76) are formed. The P wells 74, the N wells 64 and 72 are formed on the sides together with the center N isolation regions 60 and 62 as shown in FIG. 7C. In FIG. 7D the gate electrodes 112 have been formed, over the oxide layer 86, and in FIG. 7E the P bodies 82 and N+ regions 114, which will later become the N+ spacer regions 90, are formed by hetero-doping using a process described in U.S. Pat. No. 6,870,218, which is hereby incorporated by reference. Then, as shown in FIG. 10F the sidewall oxides are formed on the control and main gates 92 and 94, respectively, followed by the formation of N+ drain/collectors 52, 70 and the N+ source/emitters 80 and the formation of the P+ tap regions 88 in the hetero-doped regions which are self-aligned between the sidewall oxides of the control and main gates 92 and 94, respectively, to thereby form the N+ spacer regions 90 as shown in FIG. 7G. Silicide regions 84, 96 are formed on the P+ tap regions 88 and the drain/collectors 70 and sources/emitters 80, respectively. The silicide regions 84 are also self-aligned between the sidewall oxides of the control and main gates 92 and 94, respectively, to thereby connect the N+ spacer regions laterally. As shown in FIG. 7H, the dielectric layer 100 is then formed on top of the previously formed structures, and contacts 98 are formed in the dielectric layer 100.

Using 0.35 micron process rules the total minimum distance between each control gate 92 and the corresponding main gate 94 is about 0.5 microns. Also, the N+ spacers 90, P+ tap regions 88 and the silicide regions 84 are floating within the P body regions 82.

Figure 8:
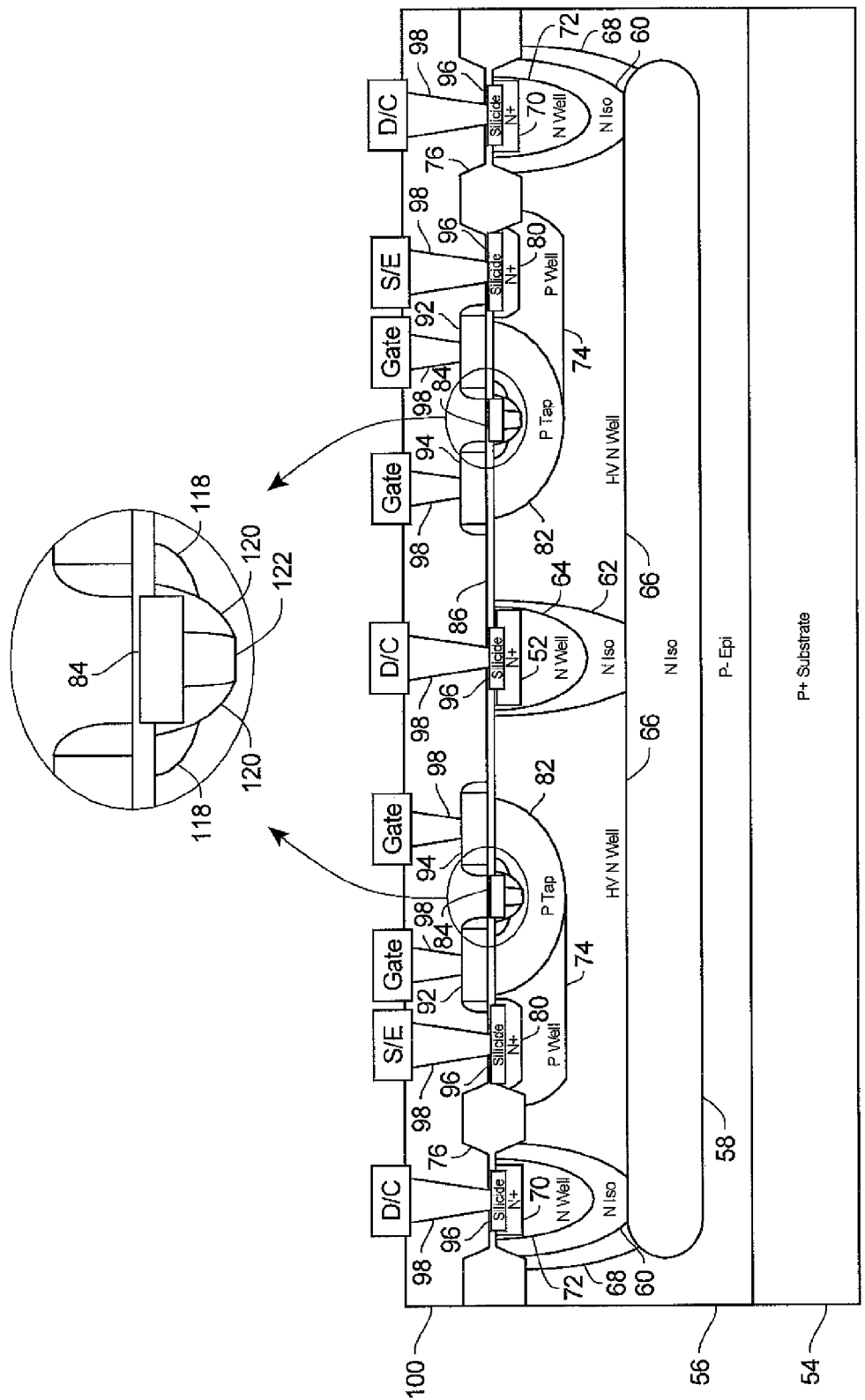
FIG. 8 is a diagrammatical view of an alternative embodiment of the hybrid-mode LDMOS device shown in FIG. 3.

FIG. 8 is a diagrammatical view of a hybrid-mode LDMOS device 116 which is an alternative embodiment of the hybrid-mode LDMOS device 50 shown in FIG. 3. In the above process description the N+ source spaces 90 and P body 82 are formed by heterodoping implants before the formation of the sidewall oxides. After the side wall oxides are in place, the P+ tap regions 90 and silicide regions 84 located between the main gate 94 and the control gate 92 for the hybrid-mode LDMOS device 50 are formed. In the alternative embodiment of FIG. 8 N type lightly doped drains (NLDD) 118 can be formed before the formation of the sidewall oxides according to a known standard LDMOS process. After the gate side wall oxides are formed, N+ implants followed by narrower P+ implants form N+ regions 120 and P+ regions 122.

Figure 9A:
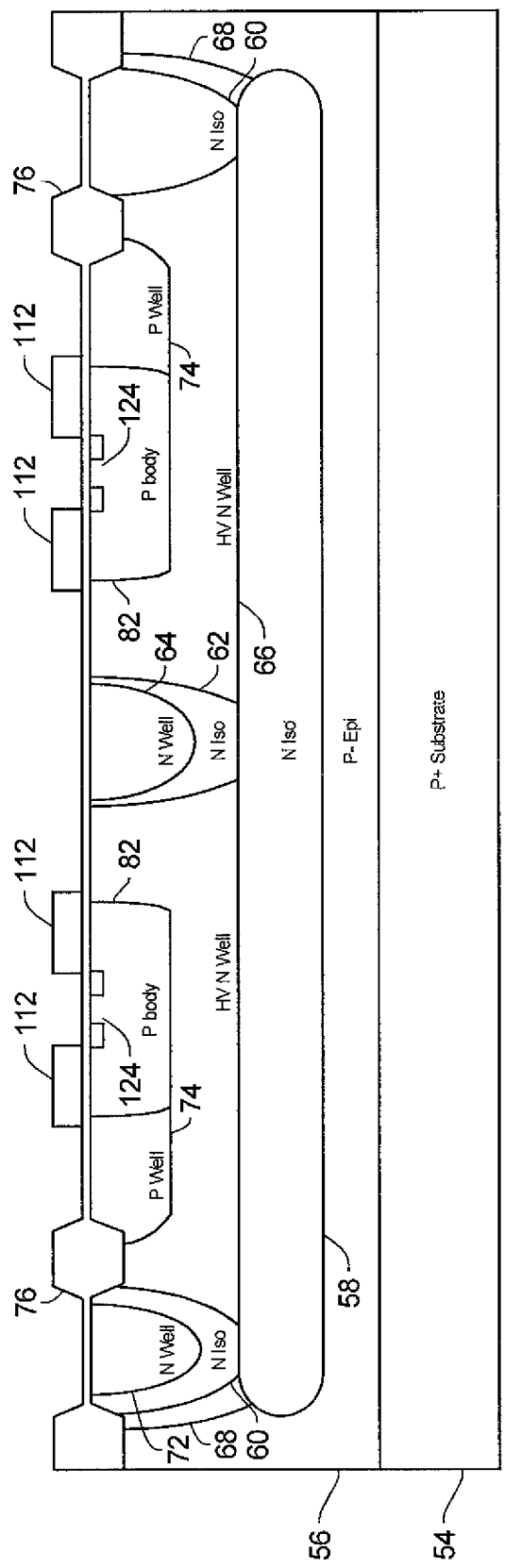
FIGS. 9A-9E are diagrammatical views of the hybrid-mode LDMOS device shown in FIG. 8 during different stages of fabrication.
Figure 9B:
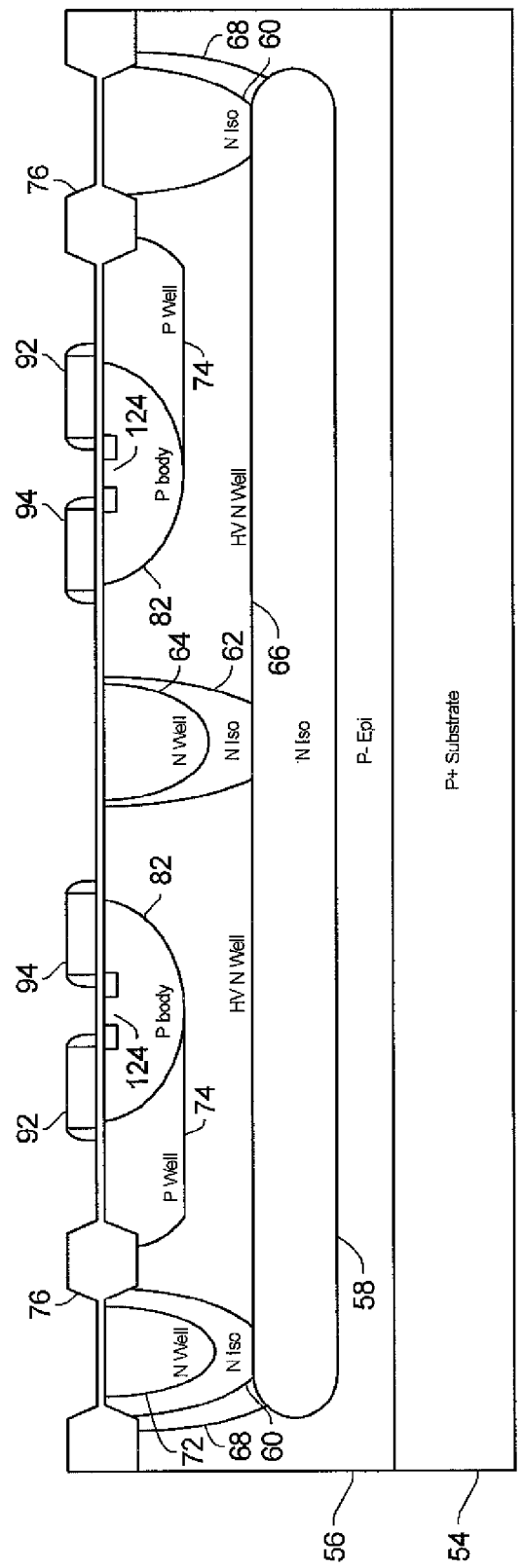
Figure 9C:
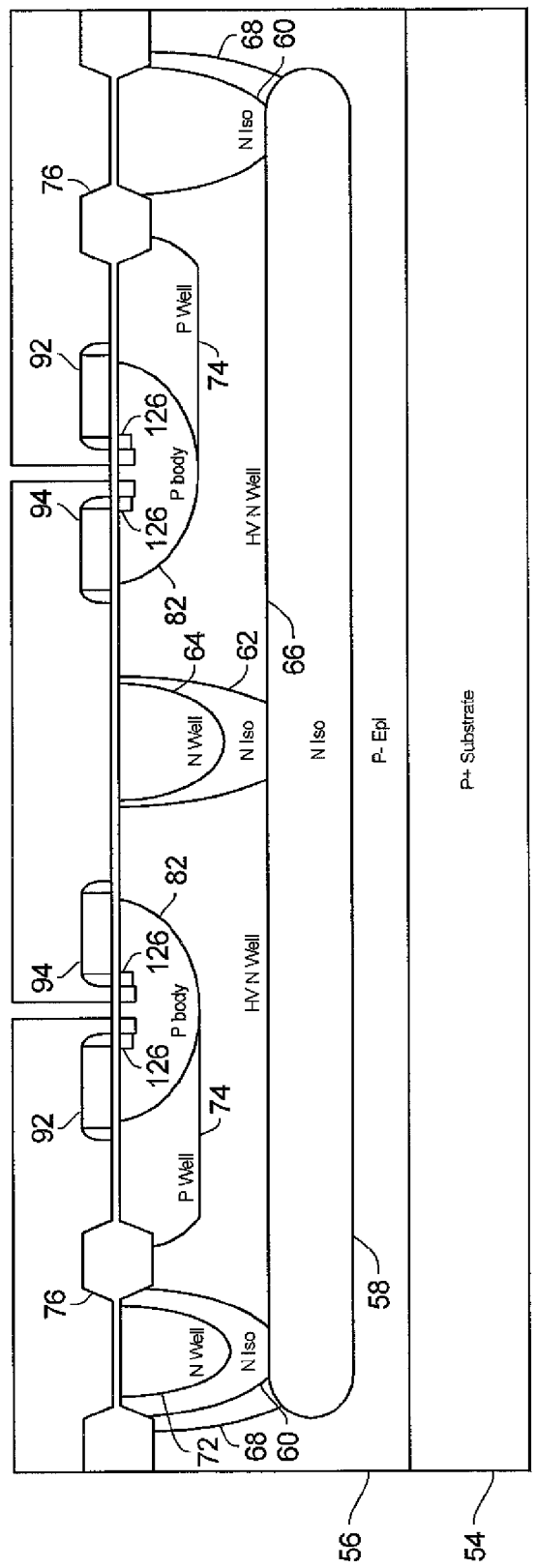
Figure 9D:
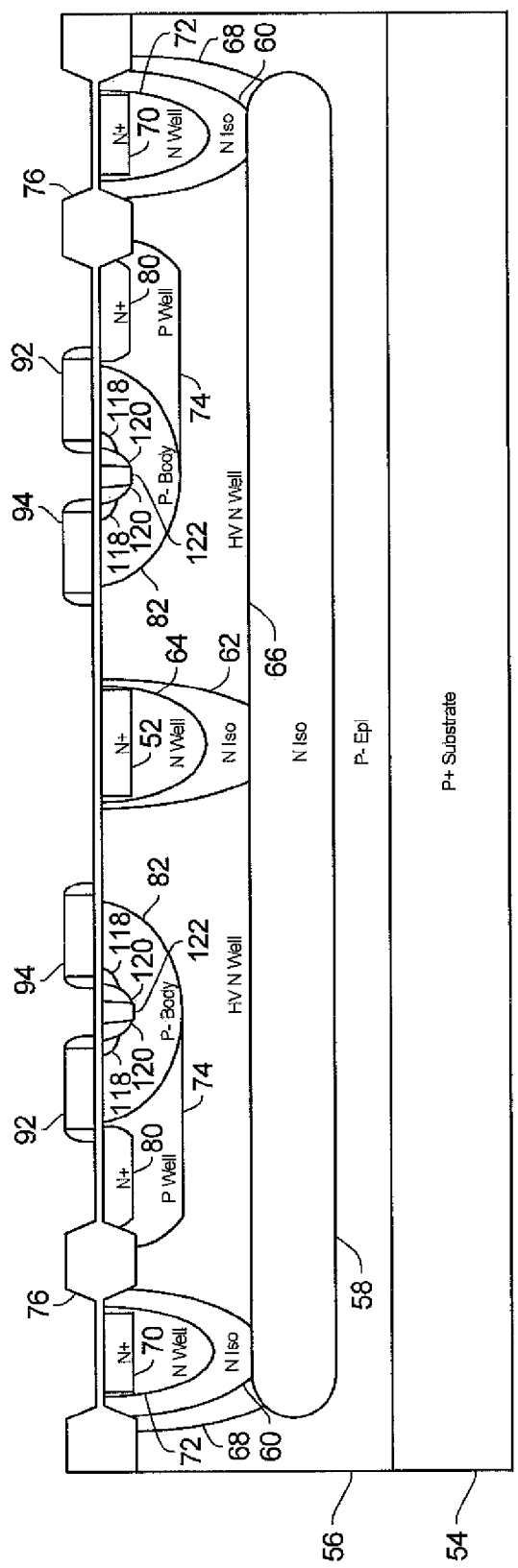
Figure 9E:
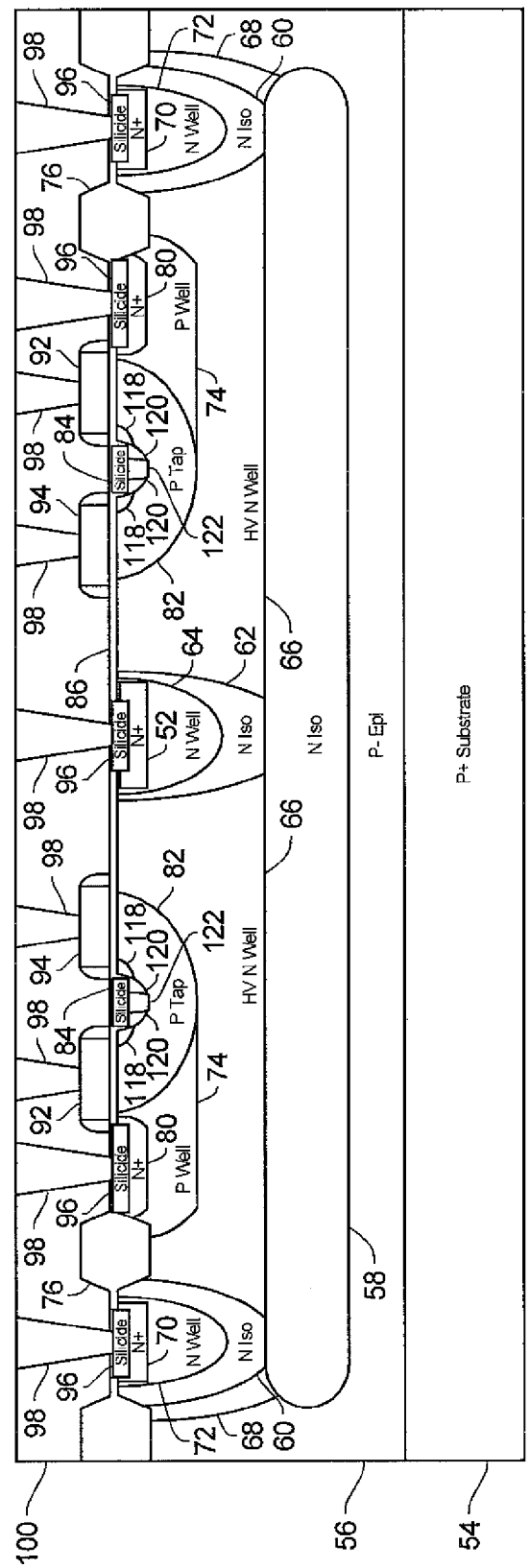

FIGS. 9A-9F are diagrammatical views of the hybrid-mode LDMOS device 116 shown in FIG. 8 during different stages of fabrication. In FIG. 9A (which follows the process step shown in 7D) N− regions 124 and the P bodies 82 are formed using two mask layers (P body and NLDD), respectively, between each pair of the gate electrodes 112 located on each side of the N well 64. The sidewall oxides are then formed on the gate electrodes 112 as shown in FIG. 9B. Using the sidewall oxides as a mask n+ regions 126 are formed and a masking layer 128 put down as shown in FIG. 9C which is used to form the P+ regions 122 shown in FIG. 9D. The additional process steps shown by FIGS. 7G and 7H are applied to the structure shown in FIG. 9D to produce the structure shown in FIG. 9E.

Figure 10A:
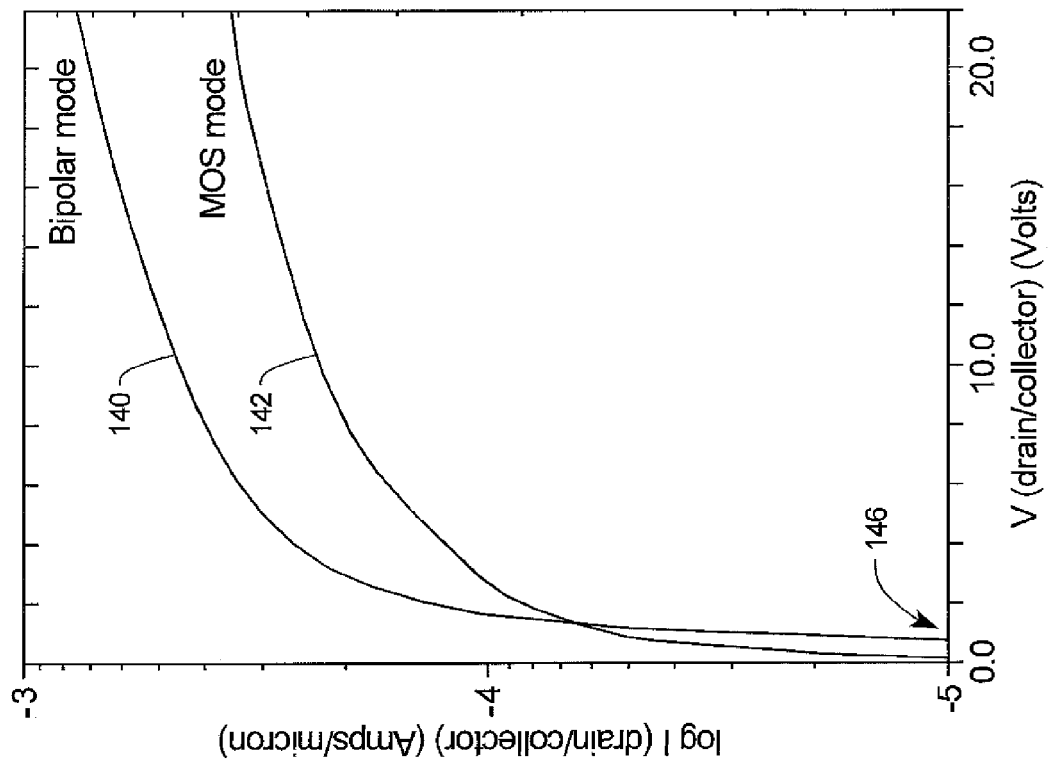
FIGS. 10A, 10B, and 10C are graphical representations of simulated forward conduction and reverse bias characteristics of the hybrid-mode LDMOS device shown in FIG. 3.
Figure 10B:
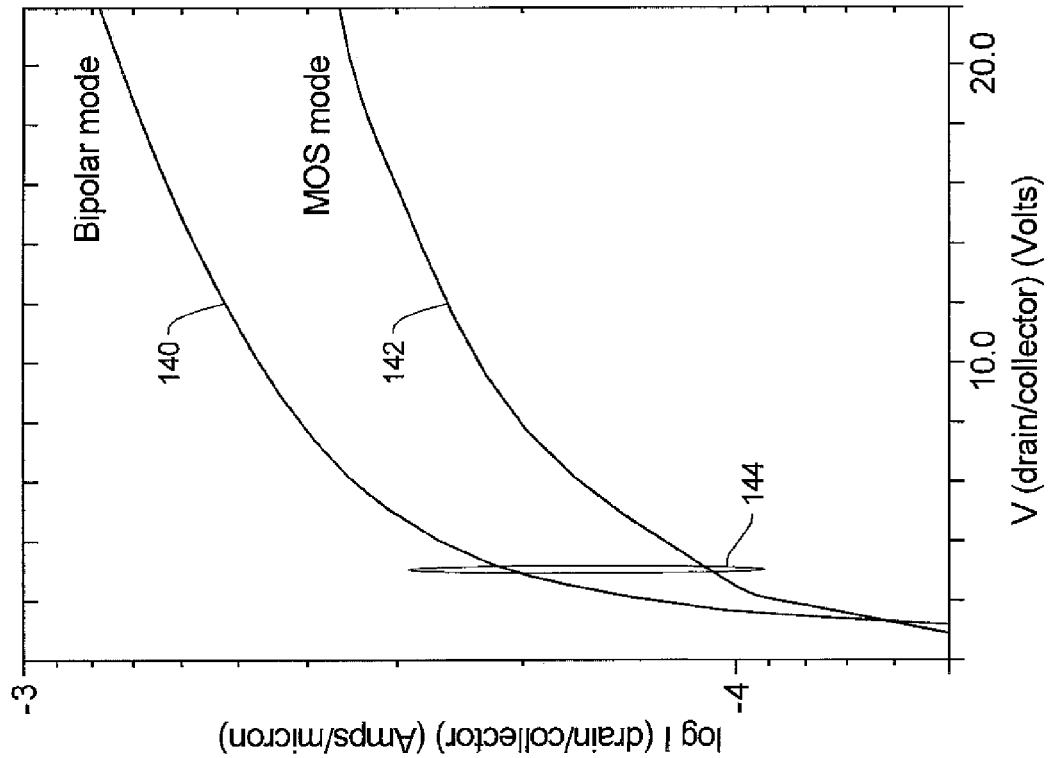
Figure 10C:
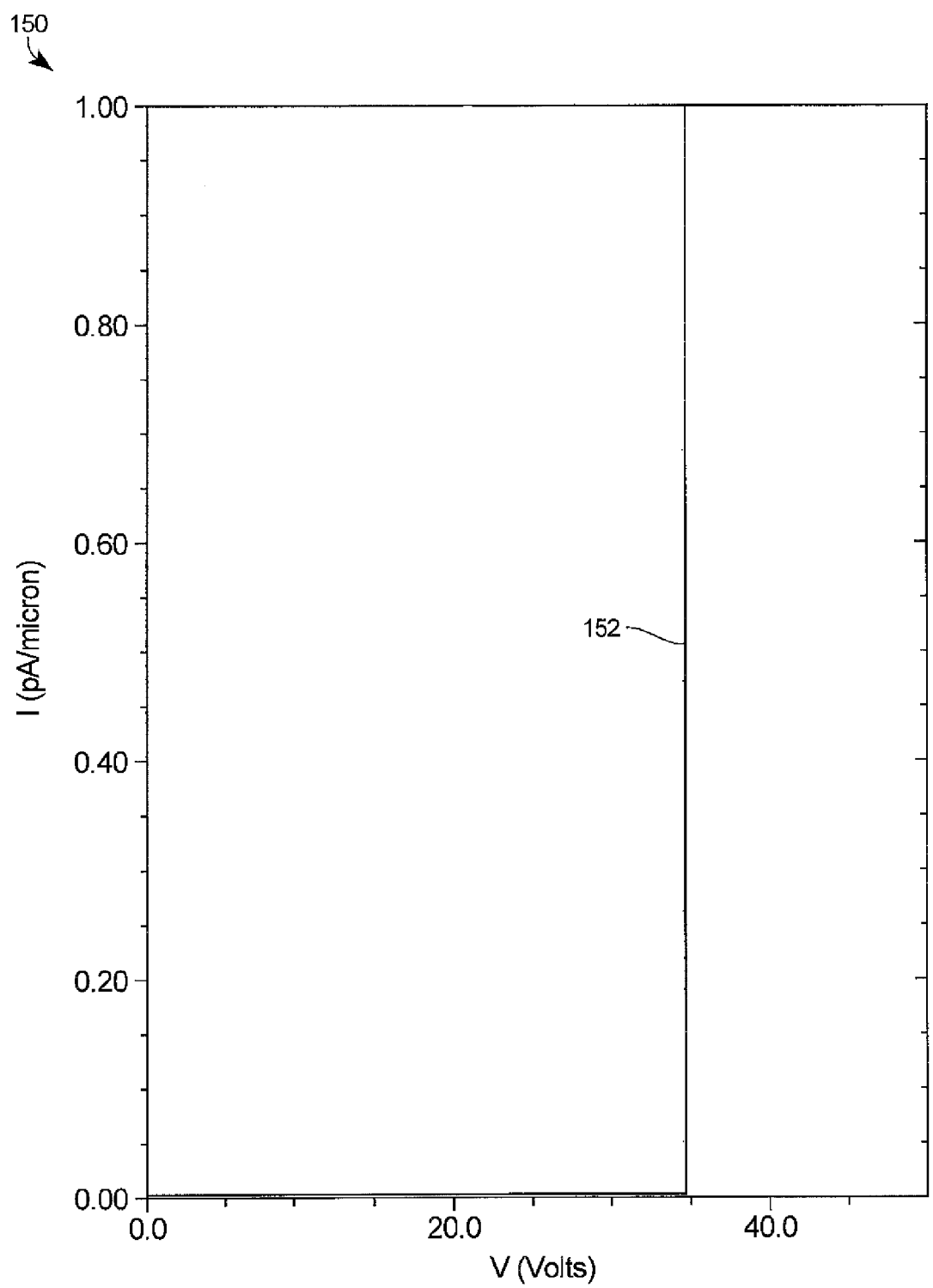

FIGS. 10A, 10B, and 10C are graphical representations of simulated forward conduction and reverse bias characteristics of the hybrid-mode LDMOS 50 device shown in FIG. 3. In FIG. 10A the simulated forward conduction characteristics of the hybrid-mode LDMOS 50 device show both the characteristics of the bipolar mode 140 and the MOS mode 142. In the region 144 there is about a 2× difference in current rating with a drain/collector voltage of 3 volts. FIG. 10B is a vertically expanded version of FIG. 10A showing the operating characteristics with drain/collector currents as low as 1e-5 amps/micron. A drain/collector to source/emitter voltage of around 0.8 volts or greater is required to turn-on the hybrid-mode device 50 when operating in the bipolar mode as indicated by the reference number 146. FIG. 10C is the simulated off-state characteristics with the main gate input 32 off and the control gate input 34 on showing a breakdown voltage of slightly less than 35 volts.

Figure 11A:
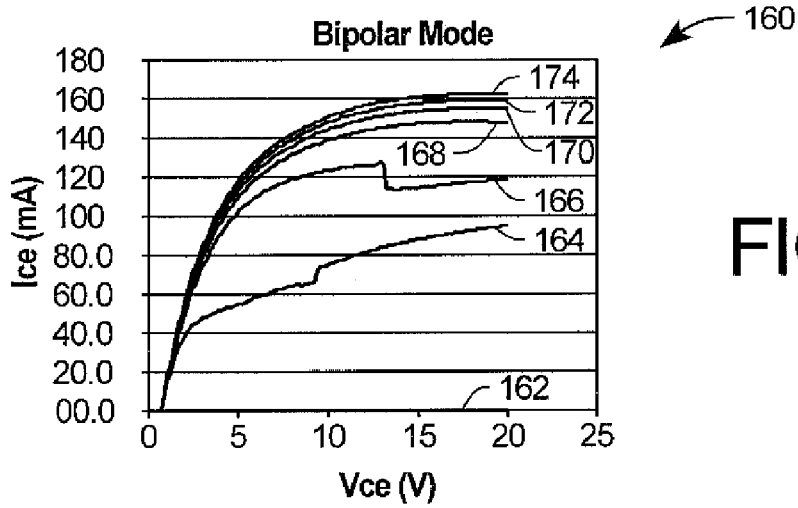
FIGS. 11A, 11B, and 11C are measured characteristics of the hybrid-mode LDMOS device shown in FIG. 3.
Figure 11B:
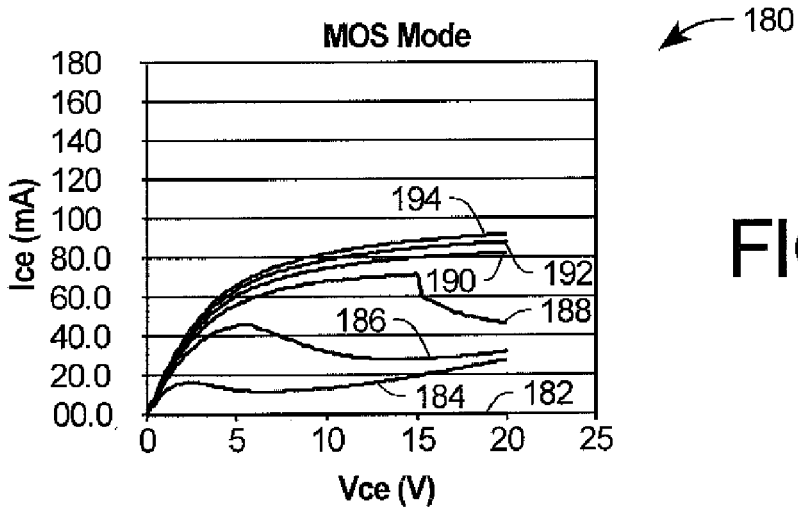
Figure 11C:
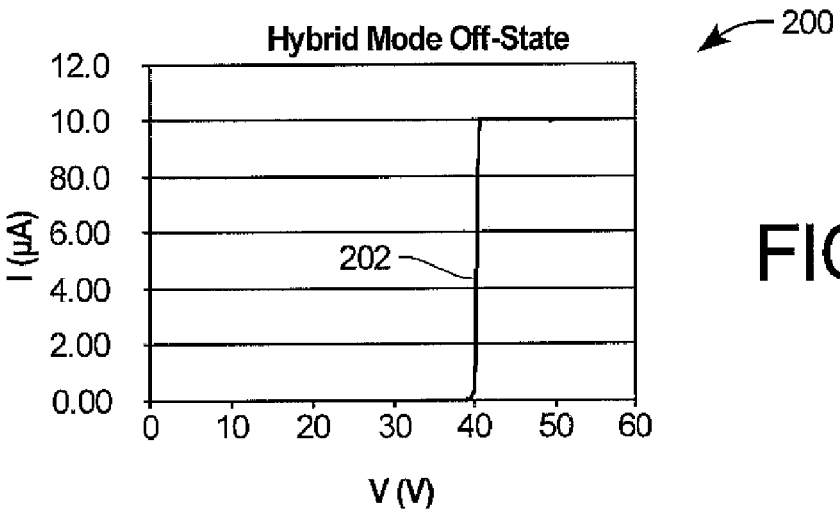

FIGS. 11A, 11B, and 11C are measured characteristics of the hybrid-mode LDMOS device 50 shown in FIG. 3. FIG. 11A shows the conductive characteristics of the hybrid-mode LDMOS 50 in the bipolar mode. The curves 162-174 are for the following voltages applied to the main gate 94 and the control gate 92 is grounded:

| Reference number | Gates to source/emitter voltage |
|---|---|
| 162 | 1 and 3 volts |
| 164 | 5 volts |
| 166 | 7 volts |
| 168 | 9 volts |
| 170 | 11 volts |
| 172 | 13 volts |
| 174 | 15 volts |

FIG. 11B shows the conductive characteristics of the hybrid-mode LDMOS 50 in the MOS mode. The curves 182-194 are for the following voltages applied to both the main gate 94 and the control gate 92:

| Reference number | Gates to source/emitter voltage |
| --- | --- |
| 182 | 1 and 3 volts |
| 184 | 5 volts |
| 186 | 7 volts |
| 188 | 9 volts |
| 190 | 11 volts |
| 192 | 13 volts |
| 194 | 15 volts |

Comparing FIGS. 11A and 11B it can be seen that the bipolar mode provides much more current through the hybrid-mode LDMOS device 50 than the MOS mode. The oscillation curves at low gate voltages in FIG. 11A and FIG. 11B are related to testing set-up in the device testing. FIG. 11C shows a reverse breakdown voltage 202 of about 40 volts when the hybrid-mode LDMOS device 50 is in the off state shown in FIG. 6.

The present invention provides a device which can be used to replace two devices, separate MOSFETs and bipolar transistors, with a single device which can operates in an MOS mode to get the output all the way to $V_{DD}$ or ground and in a bipolar mode to source or sink large currents and which has robust device performances with large safe operating area (SOA) and improved electro-static discharge (ESD) protection characteristics similar to standard bipolar power transistors. Moreover, the device can scale following CMOS lithography rules with the ability to reduce die size using present day advanced process rules. Also, there is no need to match bipolar and MOSFET device characteristics as with the circuit shown in FIG. 1.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. A semiconductor device comprising:
a) a semiconductor die having a horizontal region of a first conductivity type;
b) a first region of a second conductivity type, opposite to said first conductivity type, formed in said horizontal region and extending to a top surface of said horizontal region;
c) first and second gates positioned over corresponding first and second portions of said first region and separated from said first region by a gate oxide, said first and second portions being part of a common body;
d) a conductive region formed in said first region and positioned between said first and second portions such that channel regions below both gates create a conductive path comprising induced channels of said first conductivity type and said conductive region;
e) a first contact for connecting said horizontal region representing a drain/collector; and
f) a second contact for connecting to said first region;
g) a well of said first conductivity type extending horizontally from said first and second portions;
h) a third portion of said second conductivity type above said well;
i) a silicide region above said third portion;
j) a third contact to said silicide region;
k) a field oxide adjacent said silicide region, said third portion and said well;
l) a source/emitter positioned in said third portion and directly under said silicide region; wherein said first and second gates positioned between said drain/collector and source/emitter in a horizontal direction of the semiconductor device.

2. The semiconductor device set forth in claim 1 wherein said semiconductor device has characteristics of a MOSFET when both of said gates induce a channel of said first conductivity type below said gates.

3. The semiconductor device set forth in claim 1 wherein said semiconductor device has characteristics of a bipolar transistor when one of said gates induces a channel of said first conductivity type below said first gate and another of said gates does not induce a channel of said first conductivity type below said another gate.

4. The semiconductor device set forth in claim 1 wherein said semiconductor device is formed in an isolated region within a semiconductor die.

5. The semiconductor device set forth in claim 1 wherein said first conductivity type is N type.

6. The semiconductor device set forth in claim 1 further including first and second spacer regions of said first conductivity type adjacent opposite sides of said conductive region, said first spacer region extending to a channel region of said first gate, and said second spacer extending to a channel region of said second gate.

7. A MOS-bipolar hybrid device comprising:
a semiconductor substrate with a first conductivity-type layer holding a first conductivity-type highly doped silicide drain/collector spaced from a first conductivity-type highly doped source/emitter;
an elongated first conductivity-type drift region, at one end adjacent the first conductivity-type highly doped silicided drain/collector;
a main gate adjacent the other end of the drift region;
a control gate spaced from the main gate and adjacent the first conductivity-type highly doped source/emitter;
sequential first, second and first silicided conductivity-type highly doped regions disposed between the gates;
a second silicided conductivity-type well region below the gates and below the first conductivity-type highly doped source/emitter; wherein said first and second gates positioned between said drain/collector and source/emitter in a horizontal direction of the MOS-bipolar hybrid device.

8. The MOS-bipolar hybrid device of claim 7 wherein the second conductivity-type highly doped region between the two first conductivity-type highly doped regions is silicided.

9. The MOS-bipolar hybrid device of claim 7 further comprising a second conductivity-type body region disposed between the second conductivity-type highly doped region and the second silicide conductivity-type well wherein concentration of second conductivity type dopants in the second conductivity-type body region is less than the concentration in the second conductivity-type highly doped region and more than the second silicide conductivity-type well region.

10. The MOS-bipolar hybrid device of claim 7 wherein turning on both gates generates a current between the source and drain that is characterized by only majority charge carriers.

11. The MOS-bipolar hybrid device of claim 7 wherein turning on both gates generates a current between the source and drain that is controlled by the voltage applied to the gates.

12. The MOS-bipolar hybrid device of claim 7 wherein turning on the control gate and turning off the main gate generates a current between the emitter and collector characterized by a combination of majority and minority carriers.

13. The MOS-bipolar hybrid device of claim 7 wherein turning on the control gate and turning off the main gate generates a current between the emitter and collector that is controlled by the current in the channel under the main gate.

14. The MOS-bipolar hybrid device of claim 7 wherein the first conductivity type dopants are N-type and the second conductivity type dopants are P-type.

15. The MOS-bipolar hybrid device of claim 7 wherein the first conductivity type dopants are P-type and the second conductivity type dopants are N-type.

* * * * *